US010878757B2

(12) United States Patent
Wang

(10) Patent No.: US 10,878,757 B2
(45) Date of Patent: Dec. 29, 2020

(54) SHIFT REGISTER AND TIME-SHARING CONTROLLING METHOD THEREOF, DISPLAY PANEL AND DISPLAY APPARATUS

(71) Applicant: BOE Technology Group Co., Ltd., Beijing (CN)

(72) Inventor: Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 178 days.

(21) Appl. No.: 15/980,985

(22) Filed: May 16, 2018

(65) Prior Publication Data

US 2019/0164497 A1 May 30, 2019

(30) Foreign Application Priority Data

Nov. 27, 2017 (CN) .......................... 2017 1 1207296

(51) Int. Cl.
*G11C 19/00* (2006.01)
*G09G 3/3266* (2016.01)
(Continued)

(52) U.S. Cl.
CPC ............. *G09G 3/3266* (2013.01); *G09G 3/20* (2013.01); *G09G 3/3677* (2013.01); *G11C 7/222* (2013.01);
(Continued)

(58) Field of Classification Search
None
See application file for complete search history.

(56) References Cited

U.S. PATENT DOCUMENTS 8,031,140 B2 10/2011 Kwak
8,384,649 B2* 2/2013 Shang .................. G09G 3/3677
345/100

(Continued)

FOREIGN PATENT DOCUMENTS

CN 1617205 A 5/2005
CN 103985346 A 8/2014
(Continued)

OTHER PUBLICATIONS

First Office Action, including Search Report, for Chinese Patent Application No. 201711207296.4, dated Mar. 22, 2019, 18 pages.

*Primary Examiner* — Tuan T Lam
(74) *Attorney, Agent, or Firm* — Westman, Champlin & Koehler, P.A.

(57) ABSTRACT

Embodiments of the application provide a shift register comprising a shift signal generating circuit and at least two time-sharing controlling circuits. The shift signal generating circuit may be configured to generate a shift signal. Each of the time-sharing controlling circuits comprises a first driving sub-circuit and a second driving sub-circuit, wherein the first driving sub-circuit is configured to enable the time-sharing controlling circuit to output the shift signal during the preset period, and the second driving sub-circuit is configured to enable the time-sharing controlling circuit to output an invalid signal during the non-preset period. During a driving cycle, the first driving sub-circuits in each of the at least two time-sharing controlling circuits are turned on sequentially, so that each of the at least two time-dividing controlling circuits outputs the shift signal sequentially.

8 Claims, 7 Drawing Sheets

(51) Int. Cl.
*G11C 19/28* (2006.01)
*G11C 7/22* (2006.01)
*G09G 3/36* (2006.01)
*G09G 3/20* (2006.01)

(52) U.S. Cl.
CPC ............ *G11C 19/28* (2013.01); *G11C 19/287* (2013.01); *G09G 2310/0286* (2013.01); *G09G 2310/06* (2013.01); *G09G 2310/08* (2013.01)

(56) References Cited

U.S. PATENT DOCUMENTS

| | | | |
|---|---|---|---|
| 9,305,498 | B2 | 4/2016 | Wang |
| 9,318,218 | B2 | 4/2016 | Wang et al. |
| 9,437,325 | B2 | 9/2016 | Qian |
| 10,095,355 | B2 | 10/2018 | Yang et al. |
| 10,283,038 | B2* | 5/2019 | Zhou ................ G09G 3/20 |
| 2005/0104817 | A1 | 5/2005 | Kwak |
| 2006/0267909 | A1* | 11/2006 | Hsu .................. G09G 3/3677 345/100 |
| 2009/0040168 | A1* | 2/2009 | Liu .................. G09G 3/3677 345/100 |
| 2010/0188381 | A1 | 7/2010 | Jang |
| 2011/0316833 | A1* | 12/2011 | Chang ............... G09G 3/3677 345/211 |
| 2013/0235006 | A1 | 9/2013 | Shin et al. |
| 2014/0362067 | A1 | 12/2014 | Wang et al. |
| 2015/0325181 | A1 | 11/2015 | Wang |
| 2015/0340102 | A1 | 11/2015 | Qian |
| 2016/0012764 | A1* | 1/2016 | Xu ..................... G11C 19/28 345/204 |
| 2016/0027526 | A1* | 1/2016 | Xu ..................... G11C 19/28 345/215 |
| 2016/0148556 | A1* | 5/2016 | Tseng ............... G09G 3/3677 345/55 |
| 2016/0225341 | A1* | 8/2016 | Ma ...................... G09G 3/20 |
| 2017/0083155 | A1 | 3/2017 | Yang et al. |
| 2017/0154602 | A1* | 6/2017 | Sun ...................... G09G 3/20 |
| 2018/0301081 | A1* | 10/2018 | Wang ................ G09G 3/2092 |

FOREIGN PATENT DOCUMENTS

| | | |
|---|---|---|
| CN | 104123918 A | 10/2014 |
| CN | 104157248 A | 11/2014 |
| CN | 105047118 A | 11/2015 |
| CN | 105976749 A | 9/2016 |

* cited by examiner the first driving sub-circuits in each of the time-sharing controlling circuits are turned on sequentially during one driving cycle, so that each of the time-dividing controlling circuits outputs the shift signal sequentially — S801

SHIFT REGISTER AND TIME-SHARING CONTROLLING METHOD THEREOF, DISPLAY PANEL AND DISPLAY APPARATUS

CROSS-REFERENCE TO RELATED APPLICATION(S)

This application claims the priority of Chinese Patent Application No. 201711207296.4 filed on Nov. 27, 2017, the disclosure of which is incorporated herein by reference in its entirety as part of this application.

TECHNICAL FIELD

Embodiments of the present disclosure relate to the field of display technology, and in particular, to a shift register, a time-sharing controlling method thereof, and a display panel and a display apparatus including the shift register.

BACKGROUND

Ultra-narrow bezels have become a trend for OLED displays. For an OLED pixel compensation circuit, it is necessary to design a Gate GOA circuit for controlling a progressive scanning signal and an EM GOA circuit for controlling an emission process of the OLED. The EM GOA circuit may use one-to-multi driving scheme under the permission of the driving capability. That is, the EM GOA circuit may drive EM signals of multiple rows of pixels at the same time, thereby reducing the number of EM GOA circuits and narrowing the bezel. However, since the Gate GOA circuit outputs a progressive scan signal, it is difficult to use one Gate GOA circuit to drive multiple rows of pixel signals at the same time.

SUMMARY

According to a first aspect of embodiments of the present invention, there is provided a shift register, comprising: a shift signal generating circuit, configured to generate a shift signal; and at least two time-sharing controlling circuits, the time-sharing controlling circuits which has an inputting terminal coupled to an outputting terminal of the shift signal generating circuit, wherein each of the time-sharing controlling circuits is configured to output the shift signal during a preset period of a single driving cycle and to output an invalid signal during a non-preset period of the single driving cycle, and wherein the time-sharing controlling circuits is further configured to output the shift signal within the single driving cycle sequentially.

For example, each of the time-sharing controlling circuits comprises a first driving sub-circuit and a second driving sub-circuit, wherein the first driving sub-circuit is configured to enable the time-sharing controlling circuit to output the shift signal during the preset period, and the second driving sub-circuit is configured to enable the time-sharing controlling circuit to output the invalid signal during the non-preset period.

For another example, the first driving sub-circuit comprises a first transistor having a first electrode coupled to the outputting terminal of the shift signal generating circuit and a second electrode coupled to an inputting terminal of the second driving sub-circuit. The second driving sub-circuit comprises a second transistor having a first electrode coupled to a first voltage signal and a second electrode coupled to an outputting terminal of the time-sharing controlling circuit. A controlling electrode of the first transistor and a controlling electrode of the second transistor are coupled to different clock signals.

For another example, the second driving sub-circuit further comprises a third transistor having a first electrode coupled to the first voltage signal and a second electrode coupled to the second electrode of the first transistor, wherein the controlling electrode of the first transistor, the controlling electrode of the second transistor and a controlling electrode of the third transistor are coupled to different clock signals.

For another example, the first driving sub-circuit further comprises a fourth transistor having a first electrode coupled to the second electrode of the first transistor and a second electrode coupled to the inputting terminal of the second driving sub-circuit, wherein a controlling electrode of the fourth transistor, the controlling electrode of the first transistor and the controlling electrode of the second transistor are coupled to different clock signals.

For another example, the outputting terminals of the at least two time-sharing controlling circuit are respectively coupled to inputting terminals of at least two other time-sharing controlling circuits.

For another example, the outputting terminals of the at least two time-sharing controlling circuit are respectively coupled to other time-sharing controlling circuits which have the same amount as the at least two time-sharing controlling circuit.

For another example, the shift signal generating circuit comprises:
a fifth transistor having a first electrode coupled to an inputting terminal of the shift signal generating circuit for providing a trigger signal and a controlling electrode coupled to a first clock signal;
a sixth transistor having a controlling electrode coupled to the second electrode of the fourth transistor, a first electrode coupled to a second clock signal, and the second electrode coupled to the outputting terminal of the shift signal generating circuit;
a seventh transistor having a controlling electrode coupled to the first clock signal and a first electrode coupled to a second voltage signal;
an eighth transistor having a controlling electrode coupled to the second electrode of the seventh transistor, a first electrode coupled to the first voltage signal, and a second electrode coupled to the outputting terminal of the shift signal generating circuit; and
a ninth transistor having a first electrode coupled to the first clock signal, a second electrode coupled to the controlling electrode of the eighth transistor, and a controlling electrode coupled to the second electrode of the fifth transistor.

For another example, the shift signal generating circuit further comprises: a first capacitor having a first terminal coupled to the controlling electrode and a second terminal coupled to the second electrode of the sixth transistor, and a second capacitor having a first terminal coupled to the controlling electrode and a second terminal coupled to the first electrode of the eighth transistor.

According to a second aspect of embodiments of the present invention, there is provided a method of controlling the shift register according to embodiments of the present disclosure, comprising: turning-on the first driving sub-circuits in each of the at least two time-sharing controlling circuits sequentially during the single driving cycle, so that each of the at least two time-dividing controlling circuits outputs the shift signal sequentially.

For example, the clock signals applied to the controlling electrodes of the first transistors in the at least two time-sharing controlling circuits are different from each other, the clock signals applied to the controlling electrodes of the second transistors in the at least two time-sharing controlling circuits are different from each other, the clock signals applied to the controlling electrodes of the third transistors in the at least two time-sharing controlling circuits are different from each other and the clock signals applied to the controlling electrodes of the fourth transistors in the at least two time-sharing controlling circuits are different from each other.

According to a third aspect of embodiments of the present invention, there is provided a display panel comprising the shift register according to the embodiments of the present disclosure.

According to a fourth aspect of embodiments of the present invention, there is provided a display apparatus comprising the display panel according to the embodiments of the present disclosure.

BRIEF DESCRIPTION OF THE DRAWINGS

Those and/or additional aspects and advantages of the embodiments of the present disclosure will become apparent and easily understood from the following description of embodiments in conjunction with the accompanying drawings, in which.

DETAILED DESCRIPTION

Embodiments of the present disclosure are described in detail below, and examples of the embodiments are illustrated in the accompanying drawings, wherein the same or similar reference numbers refer to the same or similar elements or elements having the same or similar functions. The embodiments described in detail below with reference to the accompanying drawings are exemplary, which are only intended to explain the embodiments of the present disclosure, and cannot be interpreted as limiting the embodiments of the present disclosure.

Technical or scientific terms used in the embodiments of the present disclosure should be in the ordinary sense understood by those skilled in the art, unless otherwise defined. The terms of "first", "second" and the like used in the embodiments of the present disclosure do not indicate any order, quantity, or importance, but are only used to distinguish one component from another.

In addition, in the description of the embodiments of the present disclosure, the terms of "connected" or "coupled to" may indicates that two components are directly connected or the two components are connected via one or more other components. Further, the two components can be connected or coupled by wire or wirelessly.

Since sources and drains of switching transistors used in the embodiments of the present disclosure are symmetrical, the source and the drain can be interchanged. In the embodiments of the present disclosure, the gate is described as a controlling electrode according to its function, one of the source and the drain is described as a first electrode, and the other is described as a second electrode. In the following examples, the description is made by taking a P-type thin film transistor as the switching transistor for an example. Those skilled in the art can understand that the disclosed embodiments can obviously be applied to the case where the switching transistor is an N-type thin film transistor.

Figure 1:
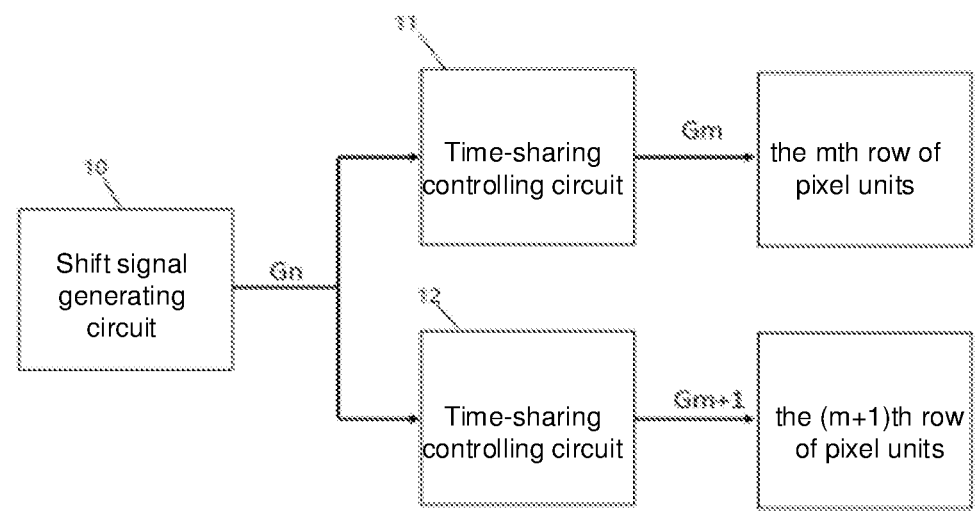
FIG. 1 shows a schematic block diagram of a shift register according to an embodiment of the present disclosure.

As shown in FIG. 1, a shift register according to embodiments of the present disclosure may comprise a shift signal generating circuit 10 and at least two time-sharing controlling circuits 11 and 12. The shift signal generating circuit 10 may be configured to generate a shift signal. Each of the at least two time-sharing controlling circuits may have an inputting terminal coupled to an outputting terminal of the shift signal generating circuit 10.

Figure 2:
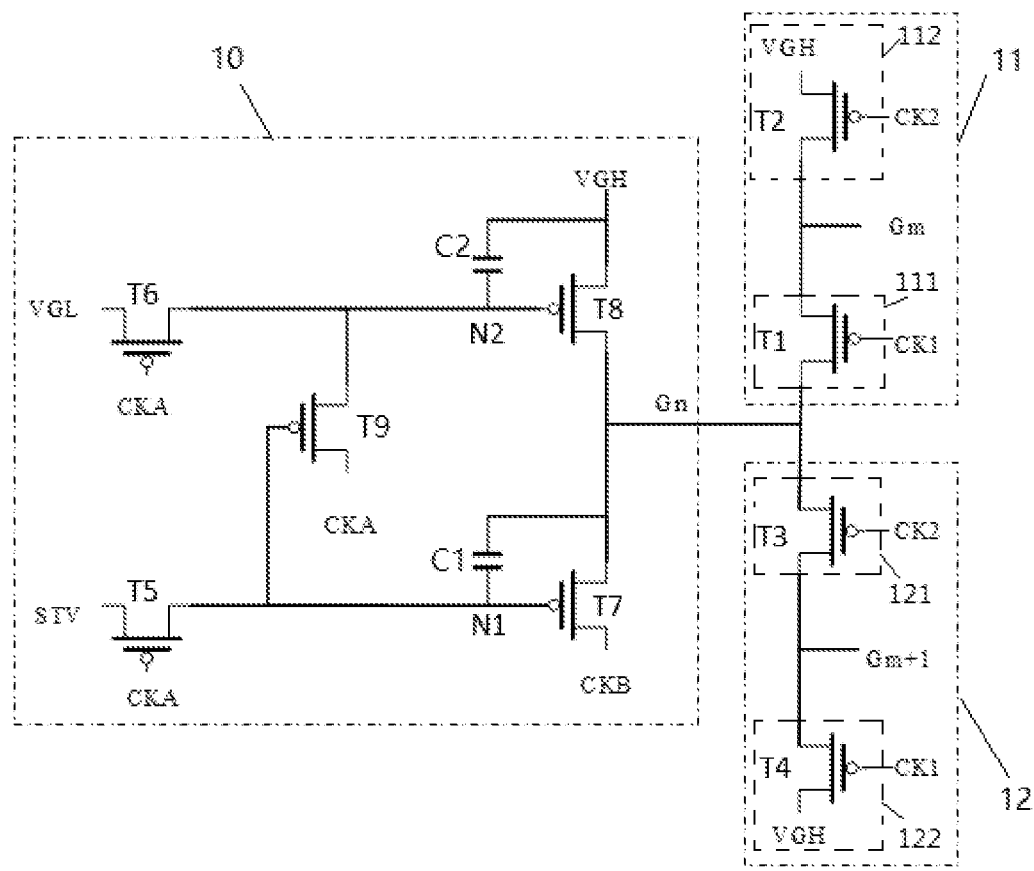
FIG. 2 shows an exemplary circuit diagram of the shift register according to an embodiment of the present disclosure.

As shown in FIG. 2, the time-sharing controlling circuit 11 may comprise a first driving sub-circuit 111 and a second driving sub-circuit 112. The first driving sub-circuit 111 is configured to enable the time-sharing controlling circuit 11 to output the shift signal during the preset period of a driving cycle. The second driving sub-circuit 112 is configured to enable the time-sharing controlling circuit 11 to output an invalid signal during the non-preset period of the driving cycle. The driving cycle may refer to a time period during which the shift register outputs a valid shift signal, such as ② period in FIG. 3. According to the embodiment of the present disclosure, the "invalid signal" refers to a voltage signal which cannot drive a pixel unit.

By turning-on the first driving sub-circuits in each of the time-sharing controlling circuits 11 and 12 sequentially during the single driving cycle so that each of the at least two time-dividing controlling circuits outputs the shift signal sequentially, it is ensured that different time-sharing controlling circuits 11 and 12 may output the shift signal during different periods.

For example, the first driving sub-circuit 111 may comprise a first transistor T1 having a first electrode coupled to the outputting terminal of the shift signal generating circuit and a second electrode coupled to an inputting terminal of the second driving sub-circuit. The second driving sub-circuit 112 may comprise a second transistor T2 having a first electrode coupled to a first voltage signal VGH and a second electrode coupled to an outputting terminal of the time-sharing controlling circuit. A controlling electrode of the first transistor T1 and a controlling electrode of the second transistor T2 are coupled to clock signals CK1 and CK2, respectively, wherein clock signals CK1 and CK2 are different from each other.

For example, the first transistor and the second transistor may be P-type TFTs, N-type TFTs, or CMOS transistors. In order to maintain the stability of the circuit, the first transistor and the second transistor may be the same type of transistors. Unless otherwise defined, the operation principle of the time-sharing controlling circuit will be described by taking the first transistor and the second transistor being the P-type TFTs as an example. It should be noted that since the first transistor and the second transistor have different functions, they may have a difference in dimensions and the like.

Figure 3:
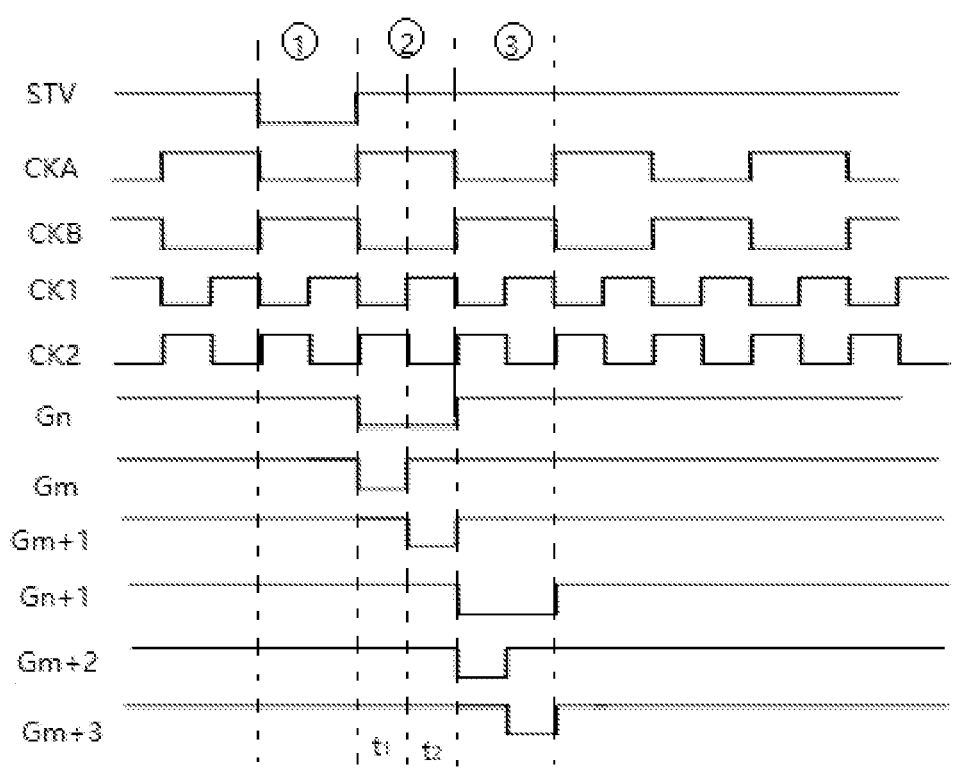
FIG. 3 shows a timing diagram of the shift register in FIG. 2.

As shown in FIGS. 2 and 3, the shift register may include a time-sharing controlling circuit 11 and another time-sharing controlling circuit 12. The time-sharing controlling circuit 11 includes a first driving sub-circuit 111 and a second driving sub-circuit 112. The first driving sub-circuit 111 includes a first transistor T1, and the second driving sub-circuit 112 includes a second transistor T2. The controlling electrode of the first transistor T1 is coupled to a clock signal CK1, and the controlling electrode of the second transistor T2 is coupled to another clock signal CK2. The clock signal CK1 has the same frequency and pulse width as the clock signal CK2. However, the phases of the clock signal CK1 and the clock signal CK2 are reversed. For example, the first electrode of the second transistor T2 is connected to the first voltage signal VGH of a high level.

As shown in FIG. 2, the time-sharing controlling circuit 12 has substantially the same configuration as the time-sharing controlling circuit 11. The difference is that the clock signal applied to the controlling electrode of the first transistor T1 in the time-sharing controlling circuit 11 (for example, the clock signal CK1) and the clock signal applied to the controlling electrode of the first transistor T1 in the time-sharing controlling circuit 12 (for example, the clock signal CK2) are different. At the same time, the clock signal applied to the controlling electrode of the second transistor T2 in the time-sharing controlling circuit 11 (for example, the clock signal CK2) and the clock signal applied to the controlling electrode of the second transistor T2 in the time-sharing controlling circuit 12 (for example, the clock signal CK1) are also different.

Inputting terminals of the time-sharing controlling circuit 11 and the time-sharing controlling circuit 12 may be coupled to the outputting terminal of the shift signal generating circuit 10, so as to receive the shift signal Gn.

As shown in FIG. 3, during a period of t1, the clock signal CK1 is a low level signal, and the clock signal CK2 is a high level signal. At this time, the first transistor T1 is turned on, and the second transistor T2 is turned off. Therefore, during the period of t1, the time-sharing controlling circuit 11 outputs the shift signal Gm corresponding to the shift signal Gn, and the time-sharing controlling circuit 12 outputs an invalid shift signal of a high level. During the period of t2, the clock signal CK1 is a high level signal, and the clock signal CK2 is a low level signal. At this time, the second transistor T2 is turned on, and the first transistor T1 is turned off. Therefore, during the period of t2, the time-sharing controlling circuit 11 outputs the invalid signal of a high level, and the time-sharing controlling circuit 12 outputs the shift signal Gm+1 corresponding to the shift signal Gn. It should be noted that in the present embodiment, the pulse widths of the clock signal CK1 and the clock signal CK2 are both one-half of the pulse width of the shift signal Gn. Thus, the time-sharing controlling circuit 11 and the time-sharing controlling circuit 12 divide the shift signal Gn into Gm and Gm+1, and output the divided shift signals.

According to an embodiment of the present disclosure, the time-sharing controlling circuit 11 outputs the shift signal Gm during the period of t1, and the time-sharing controlling circuit 12 outputs the shift signal Gm+1 during the period of t2, i.e., realizing a time-sharing output of the shift signal. As shown in FIG. 1, the shift register according to the embodiment of the present disclosure can drive two rows of externally connected pixel units. For example, the output of the time-sharing controlling circuit 11 may drive the mth row of pixel units, and the output of the time-sharing controlling circuit 12 may drive the (m+1)th row of pixel units.

As shown in FIG. 2, the shift signal generating circuit 10 according to the embodiments of the disclosure may comprise: a fifth transistor T5 having a first electrode coupled to an inputting terminal of the shift signal generating circuit for providing a trigger signal STV and a controlling electrode coupled to a first clock signal CKA; a seventh transistor T7 having a controlling electrode coupled to the second electrode of the fifth transistor for receiving the trigger signal STV, a first electrode coupled to a second clock signal CKB, and the second electrode coupled to the outputting terminal of the shift signal generating circuit 10; a sixth transistor T6 having a controlling electrode coupled to the first clock signal CKA and a first electrode coupled to a second voltage signal VGL which is different from the first voltage signal; an eighth transistor T8 having a controlling electrode coupled to the second electrode of the sixth transistor T6, a first electrode coupled to the first voltage signal VGH, and a second electrode coupled to the outputting terminal of the shift signal generating circuit 10.

In addition, the shift signal generating circuit 10 may further comprise: a first capacitor C1 having a first terminal coupled to the controlling electrode of the seventh transistor T7 and a second terminal coupled to the second electrode of the seventh transistor T7, and a second capacitor C2 having a first terminal coupled to the controlling electrode of the eightth transistor T8 and a second terminal coupled to the first electrode of the eightth transistor T8. The first clock signal CKA may have the same frequency and pulse width as the second clock signal CKB. However, their phase may be reversed with each other.

The operation of the shift signal generating circuit 10 according to an embodiment of the present disclosure will be described below with reference to the drawings.

During the period of ① in FIG. 3, the trigger signal STV is a low level signal, the first clock signal CKA is a low level signal, and the second clock signal CKB is a high level signal. Therefore, the fifth transistor T5 is turned on, and the node N1 maybe at a low level. The seventh transistor T7 is turned on, and the node N2 has a second voltage signal VGL of low level. At the same time, the controlling electrode of the ninth transistor T9 is at a low level, so the ninth transistor T9 is turned on. Thus, the node N2 is further maintained at a low level. Since N1 and N2 are all at a low level, the seventh transistor T7 and the eighth transistor T8 are turned on. In addition, since the first electrode of the seventh transistor T7 is connected to the second clock signal CKB and the first electrode of the eighth transistor T8 is connected to a first voltage signal VGH of a high level, the shift signal generating circuit 10 outputs a high level signal.

During the period of ②, the trigger signal STV is a high level signal, the first clock signal CKA is a high level signal, and the second clock signal CKB is a low level signal. Therefore, the fifth transistor T5 and the sixth transistor T6 is turned off, and the first capacitor C1 is discharged to maintain the node N1 at a low level. This in turn causes the seventh transistor T7 to be turned on, and the ninth transistor T9 is also turned on. The high-level first clock signal CKA pulls the node N2 high, thereby turning off the eighth transistor T8. Therefore, the shift signal generating circuit 10 outputs a valid shift signal Gn of a low-level. According to the bootstrap function of the first capacitor C1, after the seventh transistor T7 is turned on, the signal Gn outputted by the shift signal generating circuit 10 is changed from a high level to a low level. According to the law of conservation of electric charge, the electrode of the first capacitor C1 connected to the node N1 is pulled down to a lower potential.

During the period of ③, the trigger signal STV is a high level signal, the first clock signal CKA is a low level signal, and the second clock signal CKB is a high level signal. Thus, the fifth transistor T5 and the sixth transistor T6 is turned on, and the ninth transistor T9 is turned off. The node N1 is written to a high level and the node N2 is written to a low level. Accordingly, the seventh transistor T7 is turned off and the eighth transistor T8 is turned on. Since the first electrode of the eighth transistor T8 is connected to the first voltage signal VGH of a high level, the outputting terminal of the shift signal generating circuit 10 outputs a high-level invalid signal.

During a subsequent period, the first clock signal CKA periodically maintains the node N1 at a high level while keeping the node N2 at a low level, so that the shift signal generating circuit 10 outputs an invalid signal of a high-level until the low level STV of the next frame is arrived.

When there are a plurality of shift registers, all of the shift registers constitutes a cascade circuit. The number of stages of the cascade circuit is related to the resolution. The entire cascade circuit generally requires only one STV signal. For the nth stage of shift register, the valid shift signal Gn of a low-level can be inputted as the STV signal of the (n+1)th stage of shift register. At this time, with respect to the nth stage of shift register, positions of the CKA and CKB in the (n+1)th stage of shift register should be switched, so as to generate a valid shift signal Gn+1 of a low-level, which will not be described here.

Figure 4:
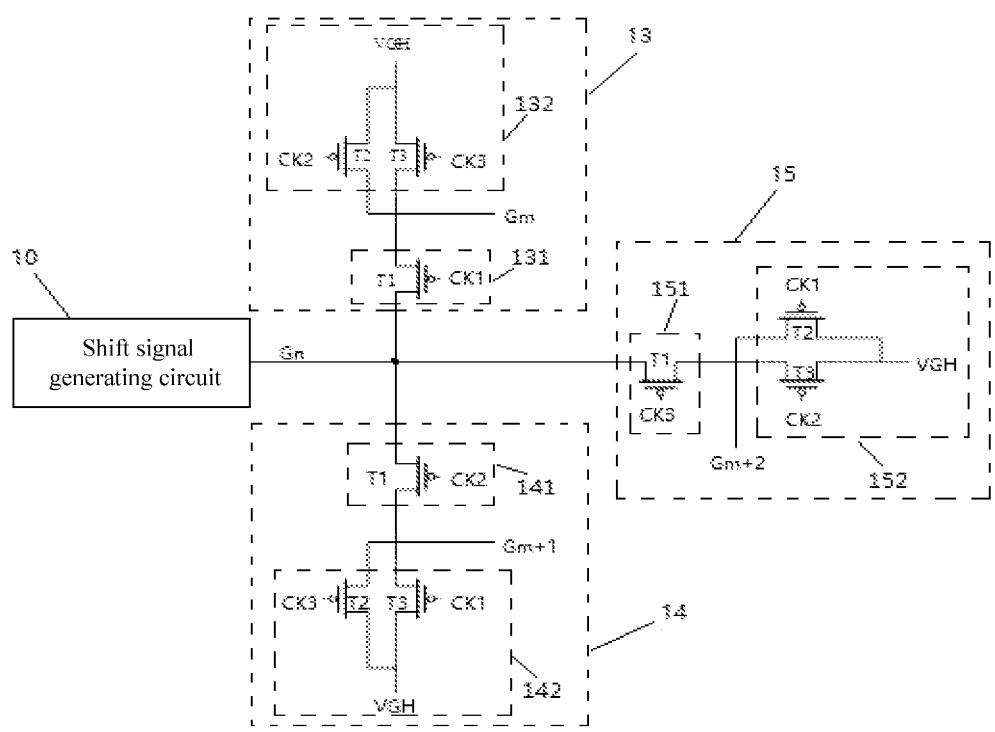
FIG. 4 shows an exemplary circuit diagram of the shift register according to an embodiment of the present disclosure.
Figure 5:
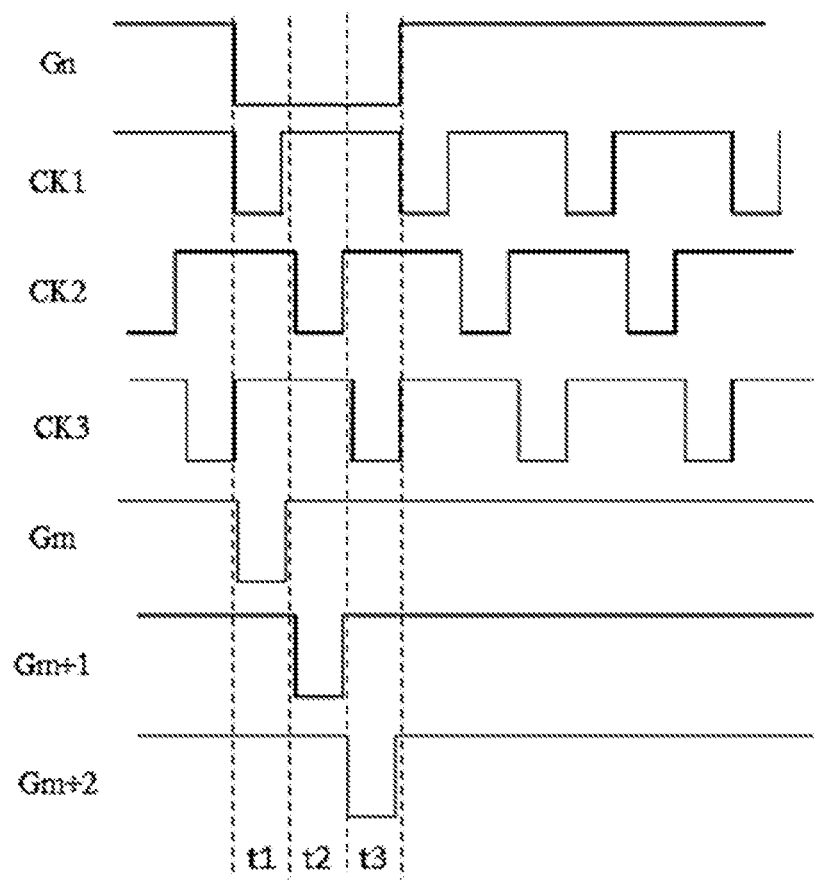
FIG. 5 shows a timing diagram of the shift register in FIG. 4.

FIG. 4 shows an exemplary circuit diagram of the shift register according to an embodiment of the present disclosure. As shown in FIG. 4, the shift register may include a time-sharing controlling circuit 13, a time-sharing controlling circuit 14, and a time-sharing controlling circuit 15. The inputting terminals of the time-sharing controlling circuit 13, the time-sharing controlling circuit 14, and the time-sharing controlling circuit 15 are respectively connected to the same shift signal Gn. The time-sharing controlling circuit 13 comprises a first driving sub-circuit 131 and a second driving sub-circuit 132. Different from the embodiment shown in FIG. 2, the second driving sub-circuit 132 may further comprise a third transistor T3 having a first electrode coupled to the first voltage signal VGH and a second electrode coupled to the second electrode of the first transistor. The controlling electrode of the first transistor T1, the controlling electrode of the second transistor T2 and a controlling electrode of the third transistor T3 are coupled to different clock signals. For example, in the time-sharing controlling circuit 13, the controlling electrode of the first transistor T1 is connected to a clock signal CK1, the controlling electrode of the second transistor T2 is connected to a clock signal CK2, and the controlling electrode of the third transistor T3 is connected to a clock signal CK3. The first electrodes of the second transistor T2 and the third transistor T3 are connected to the first voltage signal VGH of a high level. The clock signal CK1, the clock signal CK2 and the clock signal CK3 may have the same frequency, and the timing diagrams of the three clock signals are shown in FIG. 5. It should be noted that CK1 and CK2 here are different from CK1 and CK2 shown in FIG. 3. For the same shift signal Gn, the pulse widths of CK1, CK2 and CK3 in this embodiment are one third of the pulse width of Gn, and the pulse widths of CK1, CK2 in FIG. 3 are one-half of the pulse width of Gn.

The time-sharing controlling circuit 14 and the time-sharing controlling circuit 15 may have the same configuration with the time-sharing controlling circuit 13. The difference is that in the time-sharing controlling circuit 14, the controlling electrode of the first transistor T1 is connected to the clock signal CK2, the controlling electrode of the second transistor T2 is connected to the clock signal CK3, and the controlling electrode of the third transistor T3 is connected to the clock signal CK1. In the time-sharing controlling circuit 15, the controlling electrode of the first transistor T1 is connected to the clock signal CK3, the controlling electrode of the second transistor T2 is connected to the clock signal CK1, and the controlling electrode of the third transistor T3 is connected to the clock signal CK2.

Referring to FIG. 5, the time-sharing controlling circuits 13, 14 and 15 receive a shift signal Gn. During the period of t1, CK1 is a low level signal, CK2 is a high level signal, and CK3 is a high level signal. During the period of t2, CK1 is a high level signal, CK2 is a low level signal, and CK3 is a high level signal. During the period of t3, CK1 is a high level signal, CK2 is a high level signal, and CK3 is a low level signal.

Accordingly, for the time-sharing controlling circuit 13, during the period of t1, T1 is turned on, and T2 and T3 are turned off. At this time, the time-sharing controlling circuit 13 outputs a shift signal Gm corresponding to the shift signal Gn. During the period of t2, T1 is turned off, T2 is turned on, and T3 is turned off. At this time, the time-sharing controlling circuit 13 outputs the invalid signal of high-level. During the period of t3, T1 is turned off, T2 is turned off, and T3 is turned on. At this time, the time-sharing controlling circuit 13 outputs an invalid signal of high level.

For the time-sharing controlling circuit 14, during the period of t1, T1 and T2 are turned off, and T3 is turned on. At this time, the time-sharing controlling circuit 14 outputs an invalid signal of high level. During the period of t2, T1 is turned on, T2 is turned off, and T3 is turned off. At this time, the time-sharing controlling circuit 14 outputs the shift signal Gm+1 corresponding to the shift signal Gn. During the period of t3, T1 is turned off, T2 is turned off, and T3 is turned on. At this time, the time-sharing controlling circuit 14 outputs an invalid signal of high level.

For the time-sharing controlling circuit 15, during the period of t1, T1 is turned off, T2 is turned on, and T3 is turned off. At this time, the time-sharing controlling circuit 15 outputs an invalid signal of high level. During the period of t2, T1 is turned off, T2 is turned off, and T3 is turned on. At this time, the time-sharing controlling circuit 15 outputs an invalid signal of high level. During the period of t3, T1 is turned on, T2 is turned off, and T3 is turned off. At this time, the time-sharing controlling circuit 15 outputs the shift signal Gm+2 corresponding to the shift signal Gn.

In view of above, the time-sharing controlling circuit 13 outputs the shift signal Gm during the period of t1. The time-sharing controlling circuit 14 outputs the shift signal Gm+1 during the period of t2. The time-sharing controlling circuit 15 outputs the shift signal Gm+2 during the period of t3. Thus, a time-sharing output of the shift signal can be achieved. Similarly, the shift register according to the embodiment can implement a driving of three rows of pixel signals.

The shift register according to the embodiment of the present disclosure may include more time-sharing controlling circuits. The number of time-sharing controlling circuits can be designed in consideration of the driving capability.

Figure 6:
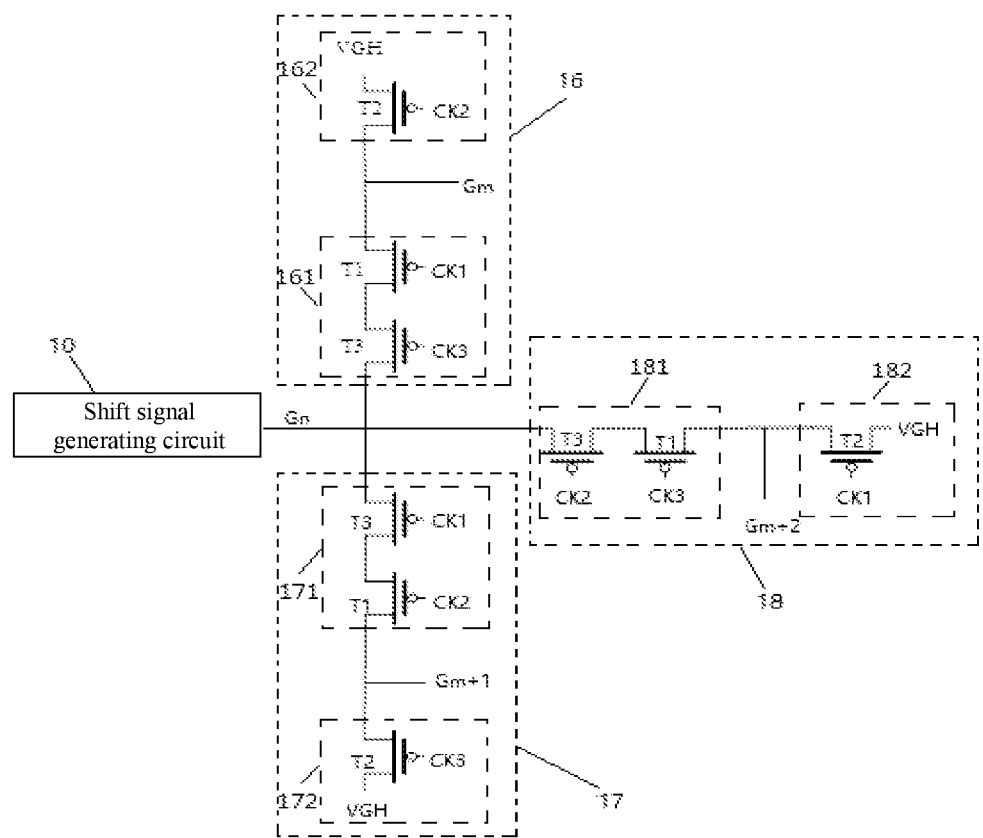
FIG. 6 shows an exemplary circuit diagram of the shift register according to an embodiment of the present disclosure.

FIG. 6 shows another exemplary circuit diagram of the shift register according to an embodiment of the present disclosure. FIG. 6 shows a typical embodiment of the shift register according to an embodiment of the present disclosure. The shift register comprises time-sharing controlling circuits 16, 17 and 18. The inputting terminals of the time-sharing controlling circuits 16, 17 and 18 are respectively connected to the same shift signal Gn. The time-sharing controlling circuit 16 includes a first driving sub-circuit 161 and a second driving sub-circuit 162. Different from the example shown in FIG. 2, the first driving sub-circuit 161 includes a fourth transistor T4 having a first electrode coupled to the second electrode of the first transistor T1 and a second electrode coupled to receive the shift signal Gn. A controlling electrode of the fourth transistor T4, the controlling electrode of the first transistor T1 and the controlling electrode of the second transistor T2 are coupled to different clock signals.

Figures 7, 8:
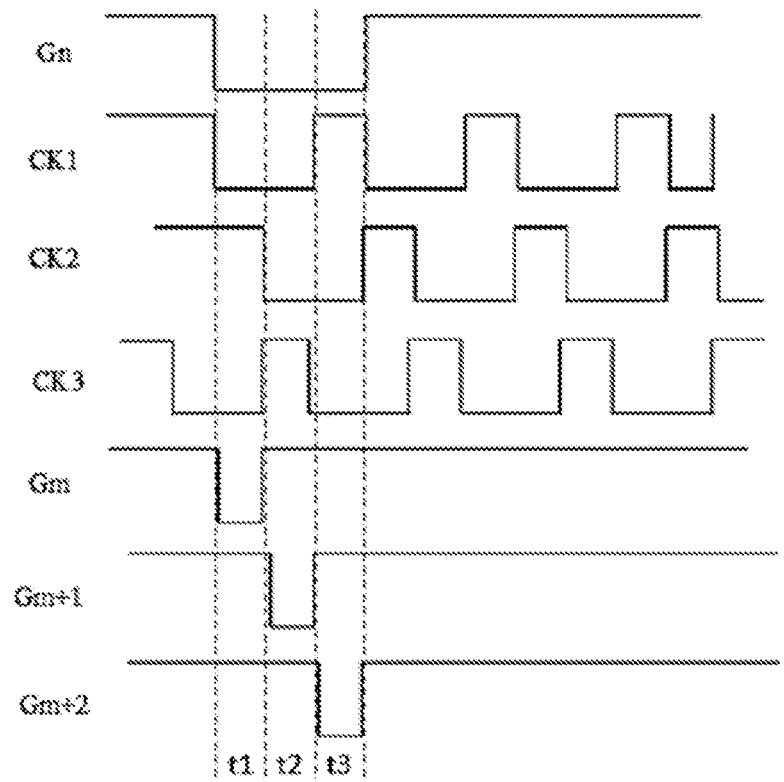
FIG. 7 shows a timing diagram of the shift register in FIG. 6.
FIG. 8 shows a flowchart illustrating a method of controlling the shift register according to an embodiment of the present disclosure.

In the time-sharing controlling circuit 16, the controlling electrode of the first transistor T1 is connected to the clock signal CK1, the controlling electrode of the second transistor T2 is connected to the clock signal CK2, the first electrode of the second transistor T2 is connected to the first voltage signal VGH of high level, and the controlling electrode of the fourth transistor T4 is connected to the clock signal CK3. The clock signal CK1, the clock signal CK2 and the clock signal CK3 may have the same pulse width, and the timing diagrams of the three clock signals are shown in FIG. 7. It should be noted that CK1 and CK2 here are different from CK1 and CK2 shown in FIG. 3. For the same shift signal Gn, the pulse widths of CK1 and CK2 in this embodiment are one third of the pulse width of Gn, and the pulse widths of CK1 and CK2 in FIG. 3 are one-half of the pulse width of Gn.

The time-sharing controlling circuit 17 and the time-sharing controlling circuit 18 may have the same configuration with the time-sharing controlling circuit 16. The difference is that in the time-sharing controlling circuit 17, the first transistor T1 is connected to the clock signal CK2, the second transistor T2 is connected to the clock signal CK3, and the fourth transistor T4 is connected to the clock signal CK1. In the time-sharing controlling circuit 18, the first transistor T1 is connected to the clock signal CK3, the second transistor T2 is connected to the clock signal CK1, and the fourth transistor T4 is connected to the clock signal CK2.

Referring to FIG. 7, the time-sharing controlling circuits 16, 17 and 18 are respectively coupled to a shift signal Gn. During the period of t1, CK1 is a low level signal, CK2 is a high level signal, and CK3 is a low level signal. During the period of t2, CK1 is a low level signal, CK2 is a low level signal, and CK3 is a high level signal. During the period of t3, CK1 is a high level signal, CK2 is a low level signal, and CK3 is a low level signal.

Accordingly, for the time-sharing controlling circuit 16, during the period of t1, the first transistor T1 is turned on, the second transistor T2 is turned off, and the fourth transistor T4 is turned on. At this time, the time-sharing controlling circuit 16 outputs the shift signal Gm corresponding to the shift signal Gn. During the period of t2, the first transistor T1 is turned on, the second transistor T2 is turned on, and the fourth transistor T4 is turned off. At this time, the time-sharing controlling circuit 16 outputs the invalid signal of high-level. During the period of t3, the first transistor T1 is turned off, the second transistor T2 is turned on, and the fourth transistor T4 is turned on. At this time, the time-sharing controlling circuit 16 outputs an invalid signal of high level.

For the time-sharing controlling circuit 17, during the period of t1, the first transistor T1 is turned off, the second transistor T2 is turned on, and the fourth transistor T4 is turned on. At this time, the time-sharing controlling circuit 17 outputs the invalid signal of high-level. During the period of t2, the first transistor T1 is turned on, the second transistor T2 is turned off, and the fourth transistor T4 is turned on. At this time, the time-sharing controlling circuit 17 outputs the shift signal Gm+1 corresponding to the shift signal Gn. During the period of t3, the first transistor T1 is turned on, the second transistor T2 is turned on, and the fourth transistor T4 is turned off. At this time, the time-sharing controlling circuit 17 outputs an invalid signal of high level.

For the time-sharing controlling circuit 18, during the period of t1, the first transistor T1 is turned on, the second transistor T2 is turned on, and the fourth transistor T4 is turned off. At this time, the time-sharing controlling circuit 18 outputs the invalid signal of high-level. During the period of t2, the first transistor T1 is turned off, the second transistor T2 is turned on, and the fourth transistor T4 is turned on. At this time, the time-sharing controlling circuit 18 outputs the invalid signal of high level. During the period of t3, the first transistor T1 is turned on, the second transistor T2 is turned off, and the fourth transistor T4 is turned on. At this time, the time-sharing controlling circuit 18 outputs the shift signal Gm+2 corresponding to the shift signal Gn.

The time-sharing controlling circuit 16 outputs the shift signal Gm during the period of t1. The time-sharing controlling circuit 17 outputs the shift signal Gm+1 during the period of t2. The time-sharing controlling circuit 18 outputs the shift signal Gm+2 during the period of t3. Thus, a time-sharing output of the shift signal can be achieved. Accordingly, the shift register according to the embodiment can implement a driving of three rows of pixel signals.

According to the embodiments of the present disclosure, the number of time-sharing controlling circuits may be designed in consideration of the driving capability.

In the shift register according to the embodiment of the present disclosure, the outputting terminals of the at least two time-sharing controlling circuit may be respectively coupled to inputting terminals of at least two other time-sharing controlling circuits.

When the outputting terminals of the time-sharing controlling circuits are respectively coupled to inputting terminals of two other time-sharing controlling circuits, the connections can be made with reference to FIG. 2. When the outputting terminals of the time-sharing controlling circuits are respectively coupled to inputting terminals of three other time-sharing controlling circuits, the connections can be made with reference to FIG. 4 or FIG. 6. The detailed description of the connection will not be discussed here.

For all of the time-sharing controlling circuits connected to the outputting terminal of the shift signal generating circuit 10, the outputting terminals of the time-sharing controlling circuits are respectively coupled to other time-sharing controlling circuits which have the same amount as the time-sharing controlling circuit. Thus, the other time-sharing controlling circuits which are connected to the outputting terminals of the time-sharing controlling circuits may output a shift signal having the same frequency.

The shift register according to the embodiments of the present disclosure can be applied not only to Gate GOA circuits but also to EM GOA circuits.

The method of controlling a shift register according to an embodiment of the present disclosure can be applied to the shift register described in any one of the above technical solutions. FIG. 8 shows a flowchart illustrating a method of controlling the shift register according to an embodiment of the present disclosure. As shown in FIG. 8, the method comprises the following steps.

At step S801, the first driving sub-circuits in each of the time-sharing controlling circuits are turned on sequentially during one driving cycle, so that each of the time-dividing controlling circuits outputs the shift signal sequentially.

Specific embodiments are referred to the embodiments of the shift register according to the present disclosure, and thus will not be described in detail. It should be noted that in this method, different time-sharing controlling circuits correspond to different preset periods, so as to ensure that multiple stages of shift signals corresponding to the same shift signal are output in a time-sharing manner.

The embodiments of the present disclosure also provide a display panel comprising the shift register according to any of the above embodiments, which may be an OLED panel, an LCD panel, an LED panel, or the like. The display panel includes the shift register described in any one of the above technical solutions. Since the shift register can output shift signals in a time-sharing manner, the same shift register can drive multiple rows of pixel units. Accordingly, the number of shift registers in the display panel can be reduced, thereby reducing the frame size of the display panel.

The embodiments of the present disclosure further provide a display apparatus comprising the display panel according to any of disclosed embodiments. The display apparatus may be any product or component having a display function, such as an electronic paper, a cell phone, a tablet, a television, a display, a laptop, a digital photo frame, a navigator and the like. Due to the use of the display panel, the display apparatus also has the advantages of the display panel, which will not be described in detail.

The foregoing descriptions are merely illustrative of the technical aspects of the present disclosure and are not intended to be limiting thereof. It should be noted that those skilled in the art may make several improvements and modifications without departing from the embodiments of the present disclosure. The improvements and modifications should also be considered within the scope of the present disclosure.

I claim:

1. A shift register, comprising:
   a shift signal generating circuit, configured to generate a shift signal;
   at least two time-sharing controlling circuits, the time-sharing controlling circuits which has an inputting terminal coupled to an outputting terminal of the shift signal generating circuit;
   wherein each of the time-sharing controlling circuits is configured to output the shift signal during a preset period of a single driving cycle and to output an invalid signal during a non-preset period of the single driving cycle; and
   wherein the time-sharing controlling circuits is further configured to output the shift signal within the single driving cycle sequentially;
      wherein each of the time-sharing controlling circuits comprises a first driving sub-circuit and a second driving sub-circuit, wherein the first driving sub-circuit is configured to enable the time-sharing controlling circuit to output the shift signal during the preset period, and the second driving sub-circuit is configured to enable the time-sharing controlling circuit to output the invalid signal during the non-preset period;
      wherein the first driving sub-circuit comprises a first transistor having a first electrode coupled to the outputting terminal of the shift signal generating circuit;
      the second driving sub-circuit comprises a second transistor having a first electrode coupled to a first voltage signal and a second electrode coupled to an outputting terminal of the time-sharing controlling circuit; and a third transistor having a first electrode coupled to the first voltage signal and a second electrode coupled to a second electrode of the first transistor; wherein the controlling electrode of the first transistor, the controlling electrode of the second transistor and a controlling electrode of the third transistor are coupled to different clock signals.

2. The shift register of claim 1, wherein the outputting terminals of the at least two time-sharing controlling circuit are respectively coupled to inputting terminals of at least one other time-sharing controlling circuits.

3. The shift register of claim 1, wherein the shift signal generating circuit comprises:
   a fifth transistor having a first electrode coupled to an inputting terminal of the shift signal generating circuit for providing a trigger signal and a controlling electrode coupled to a first clock signal;
   a sixth transistor having a controlling electrode coupled to the first clock signal and a first electrode coupled to a second voltage signal;
   a seventh transistor having a controlling electrode coupled to the second electrode of the fifth transistor, a first electrode coupled to a second clock signal, and the second electrode coupled to the outputting terminal of the shift signal generating circuit;
   an eighth transistor having a controlling electrode coupled to the second electrode of the sixth transistor, a first electrode coupled to the first voltage signal, and a second electrode coupled to the outputting terminal of the shift signal generating circuit; and
   a ninth transistor having a first electrode coupled to the first clock signal, a second electrode coupled to the controlling electrode of the eighth transistor, and a controlling electrode coupled to the second electrode of the fifth transistor.

4. The shift register of claim 3, wherein the shift signal generating circuit further comprises: a first capacitor having a first terminal coupled to the controlling electrode and a second terminal coupled to the second electrode of the seventh transistor, and a second capacitor having a first terminal coupled to the controlling electrode and a second terminal coupled to the first electrode of the eighth transistor.

5. A method of controlling the shift register of claim 1, comprising:
   turning-on the first driving sub-circuits in each of the at least two time-sharing controlling circuits sequentially during the single driving cycle, so that each of the at least two time-dividing controlling circuits outputs the shift signal sequentially.

6. The method of claim 5, wherein the clock signals applied to the controlling electrodes of the first transistors in the at least two time-sharing controlling circuits are different from each other, the clock signals applied to the controlling electrodes of the second transistors in the at least two time-sharing controlling circuits are different from each other, the clock signals applied to the controlling electrodes of the third transistors in the at least two time-sharing controlling circuits are different from each other and the clock signals applied to the controlling electrodes of the fourth transistors in the at least two time-sharing controlling circuits are different from each other.

7. A display panel comprising the shift register of claim 1.

8. A display apparatus comprising the display panel of claim 7.

* * * * *